United States Patent [19]

Inoue et al.

[11] Patent Number: 4,943,606
[45] Date of Patent: Jul. 24, 1990

[54] RESIN COMPOSITION FOR PRINTED CIRCUIT BOARD

[75] Inventors: Masakazu Inoue, Shiga; Kuniaki Asai, Tondabayashi; Kazuo Hieda, Nishinomiya; Tadayasu Kobayashi, Ibaraki, all of Japan

[73] Assignee: Sumitomo Chemical Company, Limited, Osaka, Japan

[21] Appl. No.: 236,721

[22] Filed: Aug. 26, 1988

[30] Foreign Application Priority Data

Sep. 1, 1987 [JP] Japan ................................ 62-218610

[51] Int. Cl.$^5$ .......................... C08K 3/26; C08K 7/02; C08L 67/03
[52] U.S. Cl. .................................. 523/457; 524/413; 524/424; 524/425; 524/444; 524/456; 524/500; 524/537; 524/538; 524/539; 524/540; 524/541; 524/542; 524/599; 524/604; 524/605
[58] Field of Search ............... 524/605, 424, 425, 413, 524/599, 604; 523/457

[56] References Cited

U.S. PATENT DOCUMENTS

| | | | |
|---|---|---|---|
| 4,375,530 | 3/1983 | Nay | 524/599 |
| 4,425,457 | 1/1984 | Christiansen | 524/424 |
| 4,431,770 | 2/1984 | East | 524/604 |
| 4,487,877 | 12/1984 | Takeda | 524/605 |
| 4,540,737 | 9/1985 | Wissbrun | 524/599 |
| 4,585,823 | 4/1986 | Saito | 524/605 |
| 4,719,250 | 1/1988 | Eickman | 524/599 |
| 4,837,268 | 6/1989 | Matsumoto | 524/605 |

FOREIGN PATENT DOCUMENTS 61-255957  11/1986  Japan ................................ 524/605

Primary Examiner—C. Warren Ivy
Attorney, Agent, or Firm—Stevens, Davis, Miller & Mosher

[57] ABSTRACT

A resin composition for printed circuit board comprising:
(A) 30–90% by weight of a liquid crystal polyester,
(B) 3–50% by weight of an inorganic fibrous or acicular material having an average diameter of 15 μm or below and an average length of 200 μm or below, and
(C) 3–30% by weight of an alkaline earth metal carbonate.

8 Claims, No Drawings

RESIN COMPOSITION FOR PRINTED CIRCUIT BOARD

The present invention relates to a resin composition for printed circuit board and particularly to a resin composition for printed circuit board comprising a liquid crystal polyester, an inorganic fibrous or acicular material and an alkaline earth metal carbonate.

Printed circuit boards now in use are generally produced by subjecting the so-called copper-clad laminate obtained by bonding an electroconductive copper foil to an insulating substrate [e.g., a paper (base material)-phenolic resin laminate, or a glass cloth (base material-)epoxy resin laminate], to a series of treatments such as resist pattern formation, etching, resist pattern removal and the like to form a desired electric circuit. This conventional process, however, requires troublesome mechanical processings such as drilling, beveling, blanking and external shape formation in order to enable the fixation of circuit components.

Printed circuit boards are finding their applications in all industrial fields with the technological progress in the electronics industry. Therefore, it is desired to develop a process for producing a printed circuit board which is more rationalized than the above conventional process requiring troublesome mechanical processings. As one of such production processes, there is desired a process comprising molding an insulating substrate already having a desired shape (e.g. holes) necessary for the fixation of circuit components, according to an injection molding method as used for resins, then plating the insulating substrate with an electroconductive material consisting of copper, and thereafter subjecting the copper-plated substrate to a series of treatments such as resist pattern formation, etching, resist pattern removal and the like to form a desired electric circuit.

As a material used for obtaining an insulating substrate as mentioned above according to the injection molding method, a liquid crystal polyester is noteworthy because it has excellent heat resistance particularly in soldering step (the heat resistance in soldering step is hereinafter referred to as "soldering heat resistance") and excellent mechanical properties and further has good fluidity sufficient to obtain a thin molded article under appropriate molding conditions.

As such a liquid crystal polyester, there can be cited, for example, (a) a polyester obtained by polycondensation of an oxybenzoyl compound (e.g., p-hydroxybenzoic acid), an aromatic dicarboxy compound (e.g., terephthalic acid) and an aromatic dioxy compound (e.g., 4,4'-dihydroxydiphenyl), disclosed in Japanese Patent Publication No. 47870/1972 relating to a process for producing a heat-resistant polyester, and (b) a polyester obtained by polycondensation of p-hydroxybenzoic acid and 6-hydroxy-2-naphthoic acid, disclosed in Japanese Patent Application Kokai (Laid-Open) No. 77691/1979 relating to a novel polyester.

These liquid crystal polyesters have excellent heat resistance and mechanical properties and moreover good fluidity under appropriate molding conditions. However, they cause warpage when shaped into a thin molded article such as an insulating substrate, because of a large anisotropy in physical properties, and furthermore they have a very small adhesion strength between an insulating substrate and a plating layer when the insulating substrate is plated with an electroconductive material such as copper (the adhesion strength between an insulating substrate and a plating layer is hereinafter referred to as "plating adhesion strength"). Consequently, the above liquid crystal polyesters are insufficient as a material for the insulating substrate of printed circuit board.

The above problem of warpage can be solved by a known method comprising adding to the liquid crystal polyester a long glass fiber called "chopped strands" or a potassium titanate fiber to supress the orientation of the polyester molecules and to reduce the anisotropy of its physical properties. The addition of chopped strands, however, cannot solve the problem of plating adhesion strength and moreover invites a new problem of surface smoothness that the surface of a molded article produced from the chopped strands-added polyester is not smooth sufficient for the molded article to be used in a printed circuit board. When a potassium titanate fiber is added to the above liquid crystal polyester, the warpage problem is solved as mentioned above and moreover the above problem of surface smoothness does not appear. However, the problem of plating adhesion strength remains unsolved as in the case of the addition of chopped strands.

The object of the present invention is to provide a resin composition for printed circuit board which is free from the above-mentioned problems of warpage, plating adhesion strength and surface smoothness, while retaining the excellent heat resistance (particularly, soldering heat resistance), mechanical properties and fluidity possessed by liquid crystal polyesters.

The present inventors continued a study on a resin material which can be subjected to injection molding to obtain an insulating substrate for printed circuit board having a desired shape (e.g. holes) for enabling the fixation of circuit components and capable of being well plated with an electroconductive material such as copper. As a result, it was found that a resin composition comprising a liquid crystal polyester, an inorganic fibrous or acicular material having a particular size and an alkaline earth metal carbonate provides an excellent insulating substrate. The finding has led to the completion of the present invention.

The present invention provides a resin composition for printed circuit board comprising:
(A) 30–90% by weight of a liquid crystal polyester,
(B) 3–50% by weight of an inorganic fibrous or acicular material having an average diameter of 15 μm or below and an average length of 200 μm or below, and
(C) 3–30% by weight of an alkaline earth metal carbonate.

The liquid crystal polyester used in the present invention [hereinafter referred to also as the component (A)] is not amorphous but anisotropic even in a molten state, and is orientated highly, and it is generally called a thermotropic liquid crystal polymer. It is composed of an aromatic dicarboxylic acid and an aromatic diol, or of an aromatic hydroxycarboxylic acid, or of an aromatic dicarboxylic acid, an aromatic diol and an aromatic hydroxycarboxylic acid, and becomes an anisotropic melt at 250° to 400° C. under shear. The above aromatic dicarboxylic acid, aromatic diol and aromatic hydroxycarboxylic acid can be replaced by the respective ester-forming derivatives. As the repeating structural units of the above liquid crystal polyester, the undermentioned units can be shown, for example. However, the repeating units are not restricted to them.

Examples of repeating units derived from aromatic dicarboxylic acids
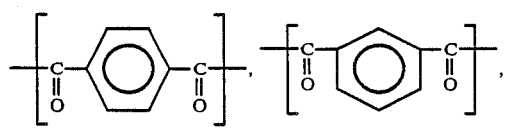
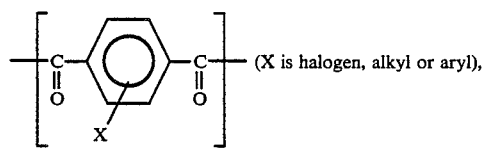 (X is halogen, alkyl or aryl),
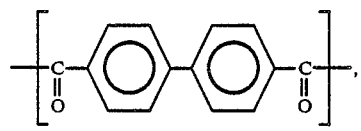
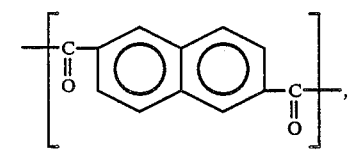
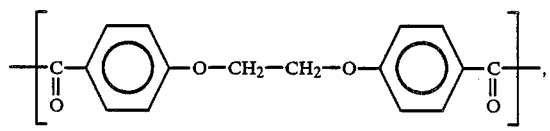
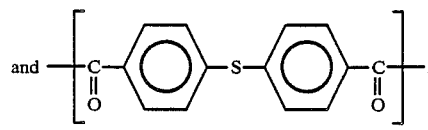
Examples of repeating units derived from aromatic diols
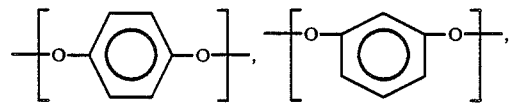
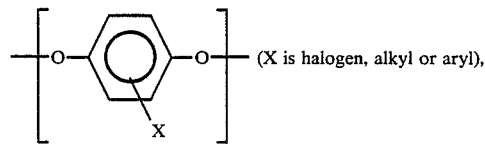 (X is halogen, alkyl or aryl),
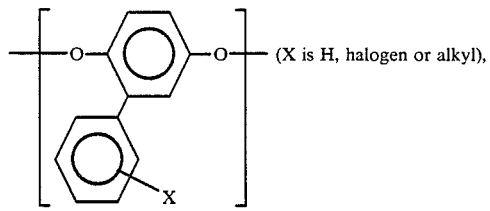 (X is H, halogen or alkyl),
-continued
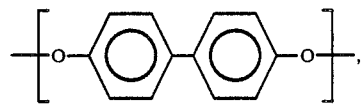
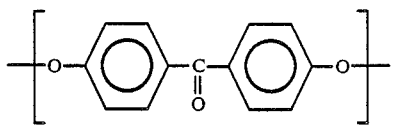
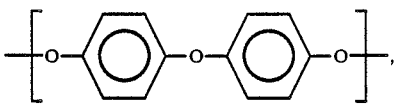
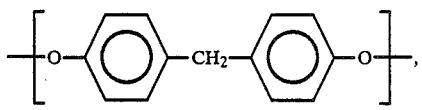
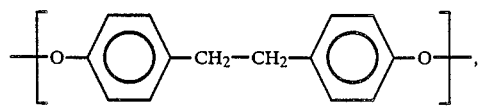
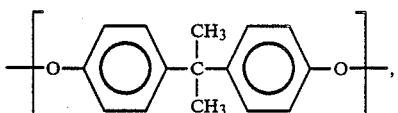
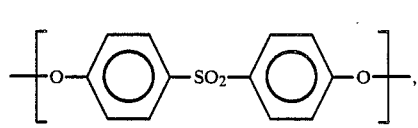
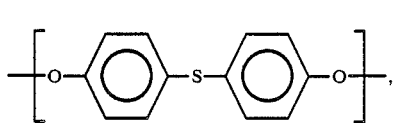
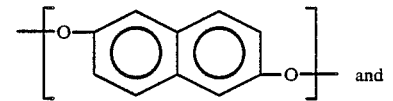 and
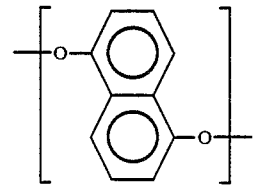
Examples of repeating units derived from aromatic hydroxycarboxylic acids
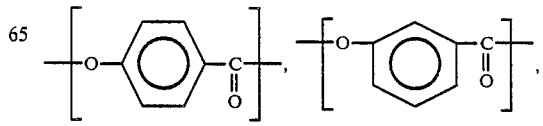

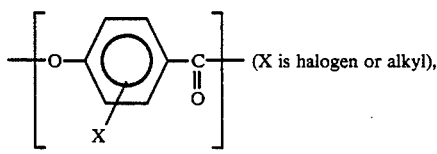 (X is halogen or alkyl),

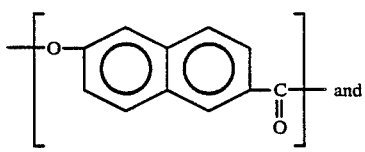 and

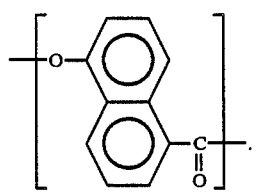

Liquid crystal polyesters which are particularly preferable from the standpoint of heat resistance, are those having one of the following combinations (I) to (IV) of repeating units:

(I) a combination of 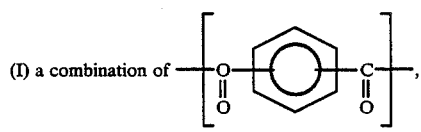,

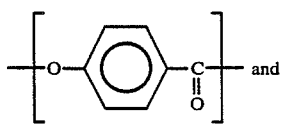 and

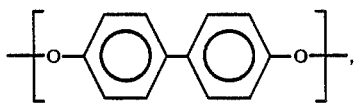, (II) a combination of 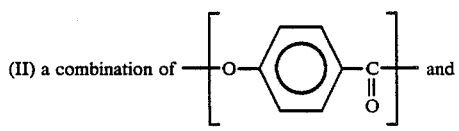 and

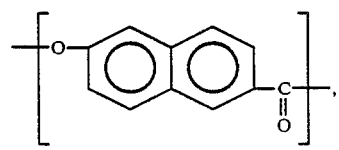, (III) a combination of 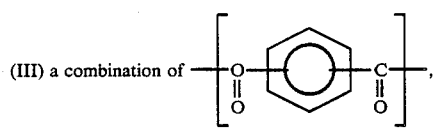,

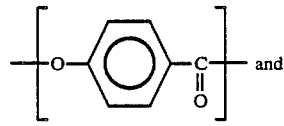 and

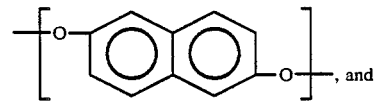, and (IV) a combination of 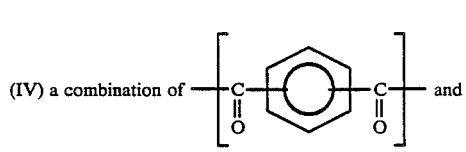 and

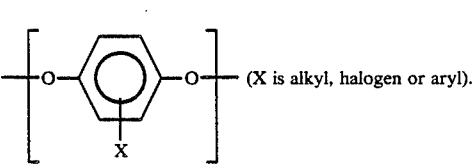 (X is alkyl, halogen or aryl).

The liquid crystal polyesters having the repeating unit combinations (I), (II), (III) and (IV) are mentioned in, for example, Japanese Patent Publication No. 47870/1972, Japanese Patent Application Kokai (Laid-Open) No. 77691/1979, Japanese Patent Application Kokai (Laid-Open) No. 50594/1979 and Japanese Patent Publication No. 40976/1983, respectively.

As the inorganic fibrous or acicular material having an average diameter of 15 μm or below and an average length of 200 μm or below, which is used in the present invention [the material is hereinafter referred to also as "the component (B)"], there can be cited, for example, a glass fiber, a potassium titanate fiber, wallastonite, a ceramic fiber composed mainly of $Al_2O_3$ and $SiO_2$, a boron fiber, a silicon carbide fiber, an alkali metal metaphosphate fiber and an asbestos fiber all having the above average diameter and average length. Particularly preferable of these are a glass fiber, a potassium titanate fiber, wollastonite and a ceramic fiber composed mainly of $Al_2O_3$ and $SiO_2$. They can be used alone or as an admixture of two or more.

As the glass fiber, there can be cited, for example, EFDE-50-31 and EFDE-75-31 which are products of Central Glass Co., as well as REV-8 which is a product of Japan Glass Fiber Co.

The potassium titanate fiber has a basic chemical composition of $K_2O.6TiO_2$ or $K_2O.6TiO_2.\frac{1}{2}H_2O$, and is an acicular crystal, and it is a kind of high strength single-crystal fibers (whiskers). It has a typical melting point of 1,300–1,350° C., an ordinary fiber diameter of 0.1–1.0 μm and a fiber length of 10–120 μm. As its commercial products, there can be cited, for example, TISMO® D and TISMO® D101 which are products of Ohtsuka Kagaku Yakuhin K. K., as well as HT 200 and HT 300 which are products of Titanium Industry Co. It is preferable that the potassium titanate fiber used in the present invention contains free potassium in an amount of 0.25% by weight or less. When the amount of free potassium is more than 0.25% by weight and if such a potassium titanate fiber is added to the liquid crystal polyester in a large proportion, the resulting resin composition has reduced heat stability when melted and causes problems of gas generation, etc., whereby the molded article produced therefrom tends to give a rough surface.

Wollastonite is a calcium metasilicate produced naturally. It is a white acicular mineral having a chemical composition represented by $CaSiO_3$ and has a specific gravity of 2.9 and a melting point of 1,540° C. As its commercial products, there can be cited, NYAD ® 400 and NYAD ® 325 which are marketed by NAGASE & CO., LTD., KEMOLIT ® ASB-3 and KEMOLIT ® ASB-4 which are marketed by Maruwa Biochemical Co., and TW-HAR-10 which is marketed by K. K. Tatsumori.

The ceramic fiber composed mainly of $Al_2O_3$ and $SiO_2$ can generally be obtained by electrically melting a roughly 50-50 mixture of high purity silica and alumina to produce a melt and then blowing off a fine stream of the melt with a high pressure air to form a ceramic fiber. Its average fiber diameter is as small as 1.8-3.0 μm and its highest working temperature is as high as 1,260° C., as compared with the glass fiber. As its commercial products, there are, for example, IBI WOOL ® CP-$U_{11}$ and IBI WOOL ® CP-$U_3$ which are products of IBIDEN CO., LTD.

These inorganic fibrous or acicular materials are used without being subjected to any treatment. However, in order to have higher affinity with the liquid crystal polyester, they may be subjected, before being mixed with the polyester, to a surface treatment with a coupling agent such as an aminosilane, an epoxysilane or the like to such an extent as the objects and effects of the present invention are not impaired.

As the alkaline earth metal of the alkaline earth metal carbonate used in the present invention [the carbonate is hereinafter referred to also as "the component (C)"], there can be cited, for example, magnesium, calcium, strontium and barium. Preferable alkaline earth metal carbonates are calcium carbonate, magnesium carbonate, and an eutectoid of calcium carbonate and magnesium carbonate, i.e., dolomite. They can be used alone or as an admixture of two or more.

Next, there are explained the compounding proportions of the components (A), (B) and (C). It is effective that the total amount of the components (B) and (C) is 10-70% by weight based on the total resin composition. When the total amount exceeds 70% by weight (that is, the amount of the liquid crystal polyester is less than 30% by weight), the resulting resin composition has insufficient melt fluidity and, even if a molded article can be produced therefrom, the molded article is very brittle. When the total amount is less than 10% by weight, the resulting resin composition has insufficient plating adhesion strength. Even when the total amount is within the range of 10 to 70% by weight, if the amount of the component (B) is less than 3% by weight based on the total resin composition, the resulting composition has too large anisotropy in physical properties and accordingly the thin molded article produced therefrom causes warpage; and on the contrary if the amount of the component (B) is more than 50% by weight based on the total resin composition, the molded article produced from the resulting resin composition and the plating layer formed on the article have poor appearances. Further, even when the total amount is within the range of 10 to 70% by weight, if the amount of the component (C) is less than 3% by weight based on the total resin composition, the resulting resin composition has insufficient plating adhesion strength; and on the contrary if the amount of the component (C) is more than 30% by weight, the resulting resin composition possesses remarkably reduced mechanical properties (particularly strength) and heat stability during molding. The more preferable compounding proportions of the components (B) and (C) based on the total resin composition are 10-40% by weight and 5-20% by weight, respectively.

The means for compounding the components (A), (B) and (C) to obtain a resin composition of the present invention has no restriction. The compounding can be conducted by feeding each component separately into a melt mixer. Alternatively, the components may be premixed in a mortar, a Henschel mixer, a ball mill, a ribbon blender or the like and then fed into a melt mixer.

The resin composition of the present invention can comprise at least one of the conventional additives such as an antioxidant, a heat stabilizer, an ultraviolet absorber, a lubricant, a releasing agent, a coloring agent (e.g., dye and pigment), a flame retardant, a flameretarding aid, an antistatic agent and the like to such an extent as the object of the present invention is not impaired. The present composition can further comprise at least one of thermoplastic resins (e.g., polyamide, polyester, polyphenylene sulfide, polyetherketone, polycarbonate, modified polyphenylene oxide, polysulfone, polyetherimide, and polyamideimide) and thermosetting resins (e.g., phenolic resin, epoxy resin, and polyimide resin) in small amounts.

The molded article produced from the present resin composition can generally be plated according to a method similar to that suitable for compositions comprising a polyalkylene terephthalate. Regarding the etching step of the molded article, in particular, the pre-etching is preferably conducted in an aqueous alkali solution. The plating procedures of the molded article are explained below.

Procedures of electroless plating (1) Preparation of base material

A molded article to be plated is annealed at 150-200° C. for 3-5 hours in a circulating hot air dryer, because in some cases the molded article has caused molding strain (residual stress) depending upon the shape.

(2) Degreasing

The annealed molded article is subjected to solvent or alkali washing to remove the dusts, organic substances, stains, fingerprints, etc. adhering thereto.

(3) Water washing (4) Pre-etching

The degreased molded article is immersed in an about 5 N aqueous sodium hydroxide solution at 60-80° C. for 15-30 minutes to selectively dissolve the skin layer and to expose the inorganic fibrous or acicular material and the alkaline earth metal carbonate contained in the molded article.

(5) Etching

The pre-etched molded article is immersed in a mixture consisting of 400 g/l of chromic anhydride and 200 ml/l of concentrated sulfuric acid at 40-80° C. for 5-30 minutes to dissolve the exposed alkaline earth metal carbonate and to form unevenness on the surface.

(6) Water washing (7) Neutralization

The alkali residue on the surface of the etched molded article is treated with hydrochloric acid in order to later effect good catalyst adhesion and smooth electroless plating.

(8) Water washing (9) Catalyzing

The resulting molded article is immersed in a mixed solution of hydrochloric acid and stannous chloride at 20–35° C. for 2–5 minutes to bond a catalyst layer to the etched surface.

(10) Water washing

(11) Accelerating

The catalyzed molded article is immersed in a mixed solution of palladium chloride and hydrochloric acid at 30–50° C. for 2–5 minutes to remove the tin component of the catalyst adsorbed on the surface and to activate the surface with palladium.

(12) Water washing

(13) Electroless plating

The catalyzed and accelerated molded article is immersed in a solution composed mainly of nickel sulfate or copper sulfate at 30–50° C. for 10–15 minutes to form a nickel or copper film of 0.3–0.5 μm in thickness.

Procedures of electroplating

The electroless-plated molded article obtained above, as a negative electrode, and a phosphorus-containing copper as a positive electrode are placed in a copper sulfate solution, and an electric current is passed between the two electrodes at a current density of 3 A/dm$^2$ for 40–80 minutes to form a plating film of 30–50 μm in thickness on the surface of the molded article.

In applying the resin composition of the present invention to a printed circuit board, the formation of an electric circuit on the insulating substrate produced from the composition can be effected by various methods which have been proposed heretofore. The formation of an electric circuit by, for example, the semi-additive method can be achieved according to the following steps. That is, a resin composition of the present invention is molded into a desired shape by injection molding; the entire surface of the molded article on which an electric circuit is to be formed, is copper-plated in a thickness of about 0.3–0.5 μm according to an electroless copper plating method; a negative image of a desired circuit pattern is printed on the copper-plated surface with a resist ink; the entire surface (excluding the resist ink-printed portions) is copper-plated in a thickness of about 50 μm according to an electroplating method; the resist ink is removed with a resist ink-peeling solution; lastly, the portions of the electroless-plated copper film beneath the resist ink-printed portions are removed with an etching solution to form a desired circuit.

According to the present invention, by compounding (A) a liquid crystal polyester, (B) an inorganic fibrous or acicular material having a size as specified in the claims and (C) an alkaline earth metal carbonate in specified proportions, there can be obtained a resin composition for printed circuit board which is free from the problems associated with warpage, plating adhesion strength and surface smoothness while retaining the excellent heat resistance (particularly, soldering heat resistance), mechanical properties and fluidity possessed by liquid crystal polyesters.

As shown in Comparative Examples which follow, it is impossible to obtain a resin composition for printed circuit board as intended by the present invention, when the compounding proportions of the components (A) to (C) and the size of the component (B) are outside the respective ranges specified in the present invention. In contrast, excellent resin compositions for printed circuit board as intended by the present invention can be obtained in Examples which fall within the scope of the present claims. By subjecting these resin compositions of the present invention to injection molding, thin insulating substrates for printed circuit board can be produced easily, and these insulating substrates, having an excellent plating adhesion strength and excellent surface smoothness, make it possible to form a circuit of fine line width thereon. As a matter of course, the resin composition of the present invention can also be used in various applications requiring plating, other than the insulating substrate for printed circuit board.

The present invention is illustrated in more detail by way of Examples. However, the present invention is not restricted to these Examples.

In the Examples, physical properties were measured according to the following methods.

Flow temperature

This was measured using a Koka type flow tester (Model CFT-500 manufactured by Shimadzu Corp). Flow temperature is a temperature at which a molten resin obtained by heating at a temperature elevation rate of 4° C./min shows a melt viscosity of 48,000 poises when the molten resin is extruded from a nozzle of 1 mm in the inside diameter and 10 mm in the length under a load of 100 kg/cm$^2$ A resin of lower flow temperature has higher fluidity.

Optical anisotropy

The optical anisotropy of a resin in a molten state was measured by heating the powdery resin on a heating stage under a polarized light at a rate of 25 ° C./min and observing the molten resin by visual inspection.

Anisotropy in degree of shrinkage

A molded article was measured for dimensions in a flow direction (MD) and a direction orthogonal to the flow direction (TD), and these dimensions were expressed as ratios to the respective mold dimensions.

Tensile strength

This was measured according to ASTM D 638.

Elastic modulus in bending

This was measured according to ASTM D 790.

Heat distortion temperature (load: 18.6 kg/cm$^2$)

This was measured according to ASTM D 648.

Soldering heat resistance

There was prepared a test piece for measurement of soldering heat resistance by cutting the molded article form measurement of anisotropy in degree of shrinkage in a width of 10 mm in the length direction, and the test piece was immersed in a solder bath H60A consisting of 60% of tin and 40% of lead, of 260° C., and then the solder bath temperature was elevated at intervals of 10° C. by keeping each temperature stage for 20 seconds. The highest temperature at which the test piece gave no foaming or no distortion under the above temperature elevation condition was recorded as the soldering heat resistance of the test piece. For instance, when a test piece gave foaming or distortion for the first time at 310° C., the soldering heat resistance of the test piece is 300° C.

Plating adhesion strength

This was measured according to JIS C 6481 (90° peeling, peeling rate: 50 mm/min).

REFERENTIAL EXAMPLE 1

Production of liquid crystal polyester A

Into a polymerization tank equipped with a comb-shaped impeller were fed 7.2 kg (40 moles) of p-acetoxybenzoic acid, 2.49 kg (15 moles) of terephthalic acid, 0.83 kg (5 moles) of isophthalic acid and 5.45 kg (20.2 moles) of 4,4'-diacetoxydiphenyl. The mixture was heated with stirring in a nitrogen gas atmosphere and polymerized at 330° C. for 3 hours with vigorous stirring while removing acetic acid formed as a by-product. Then, the polymerization system was cooled slowly, and at 200° C., the reaction mixture was taken out of the system. The yield of the reaction mixture was 10.38 kg which was 97.8% of the theoretical yield. It was pulverized with a hammer mill produced by Hosokawa Micron Co. to obtain particles of 2.5 mm or below. The particles were treated under a nitrogen gas atmosphere in a rotary kiln at 280° C. for 5 hours to obtain a fully aromatic polyester of particulate form having a flow temperature of 326° C. (the polyester is hereinafter referred to as "the liquid crystal polyester A"). This polymer showed an optical anisotropy at 350° C. or above.

REFERENTIAL EXAMPLE 2

Production of liquid crystal polyester B 7.2 kg (40 moles) of p-acetoxybenzoic acid, 3.32 kg (20 moles) of terephtalic acid and 5.45 kg (20.2 moles) of 4,4'-diacetoxydiphenyl were polymerized under the same conditions as in Referential Example 1 to obtain a reaction mixture. The mixture was pulverized in the same manner as in Referential Example 1 and then treated under a nitrogen gas atmosphere in a rotary kiln at 280° C. for 3 hours to obtain a fully aromatic polyester of particulate form having a flow temperature of 325° C. (the polyester is hereinafter referred to as "the liquid crystal polyester B"). This polymer showed an optical anisotropy at 355° C. or above.

REFERENTIAL EXAMPLE 3

Production of liquid crystal polyester C

Into a polymerization tank equipped with a comb-shaped impeller were fed 8.1 kg (45 moles) of p-acetoxybenzoic acid and 6.9 kg (30 moles) of 6-acetoxy2-naphthoic acid. The mixture was heated with stirring in a nitrogen gas atmosphere and polymerized at 300° C. for 30 minutes, at 320° C. for 30 minutes, and at 320° C. for 2 hours under a reduced pressure of 8.0 Torr. During the polymerization, the acetic acid formed as a by-product was continuously distilled out of the system. Then, the system was cooled slowly, and at 180° C. the reaction mixture was taken out of the system. The yield of the reaction mixture was 10.1 kg, which was 96.2% of the theoretical yield. The reaction mixture was pulverized in the same manner as in Referential Example 1 and treated under a nitrogen gas atmosphere in a rotary kiln at 260° C. for 5 hours to obtain a fully aromatic polyester of particulate form having a flow temperature of 260° C. (the polyester is hereinafter referred to as "the liquid crystal polyester C"). This polymer showed an optical anisotropy at 340° C. or above.

EXAMPLES 1 to 10

Three-component mixing was effected according to a compounding recipe as shown in Table 1, using as the component (A) the liquid crystal polyester A; as the component (B), one member selected from the group consisting of a glass fiber having an average diameter of 6 μm and an average length of 50 μm (EFDE-50-31 produced by Central Glass Co.), a potassium titanate fiber having a diameter of 0.3–1.0 μm and a length of 20–120 μm (HT-200 produced by Titanium Industry Co.), wallastonite having a diameter of 10 μm or below and a length of 50 μm or below (NYAD® 400 marketed by NAGASE & CO., LTD.) and a ceramic fiber composed mainly of $Al_2O_3$ and $SiO_2$ and having an average diameter of 1.8 μm and an average length of 100 μm (IBI WOOL® CP-U3 produced by IBIDEN CO., LTD.); and as the component (C), one member selected from the group consisting of calcium carbonate, magnesium carbonate and dolomite. The mixture was melt-kneaded at 320–350° C. using a twin-screw extruder (PCM-30 manufactured by Ikegai Corp.), and the resulting strands were water-cooled and then cut to obtain pellets.

The pellets were molded using an injection molding machine (NETSTAL® 47/28 manufactured by SUMITOMO HEAVY INDUSTRILES, LTD.; cylinder temperature: 330–350° C.; die temperature: 130° C.) to obtain a test piece for anisotropy in degree of molding shrinkage (64 mm in length, 64 mm in width and 1 mm in thickness, film gate), a test piece for tensile strength, a test piece for elastic modulus in bending and a test piece for heat distortion temperature. Further, there was molded a test piece for plating properties (a disc of 100 mm in diameter and 1.6 mm in thickness), and this test piece was subjected to a plating treatment according to the abovementioned steps, and then the plated test piece was measured for the appearance of plating layer by visual inspection, as well as for the adhesion strength of plating layer.

As clear from Table 1, in each resin composition, the tensile strength, elastic modulus in bending, heat distortion temperature and soldering heat resistance were high; the anisotropy in degree of shrinkage was low and no warpage was seen; and the plating layer had a fine appearance, a smooth surface and a high plating adhesion strength.

In Examples 5, 7, 8 and 10, circuits having a line width of 0.2 mm were formed using the respective plated test pieces, according to the above-mentioned method. Good circuits were obtained in all of the cases.

COMPARATIVE EXAMPLES 1 TO 7

Each test piece was obtained and its physical properties were measured in the same manner as in Examples 1 to 10 except that there were used compounding recipes as shown in Table 1.

As clear from Table 1, compositions comprising a glass fiber, a potassium titanate fiber, wallastonite or a ceramic fiber in an amount of less than 3% by weight (Comparative Examples 1, 5, 6 and 7) gave a very large anisotropy in degree of shrinkage and some of them caused warpage. In a composition comprising a glass fiber in an amount of more than 50% by weight (Comparative Example 2), the appearances of the molded article and the plating layer were very poor. A composition comprising an alkaline earth metal carbonate in an amount of less than 3% by weight (Comparative Example 3) showed an insufficient plating adhesion strength. A composition comprising an alkaline earth metal carbonate in an amount of more than 30% by weight (Comparative Example 4) showed poor heat stability during processing, gave silver streaks on the surface of the molded article and had poor mechanical properties.

EXAMPLES 11 to 15

The procedures of Examples 1 to 10 were repeated except that the liquid crystal polyester B was used as the component (A). The results are shown in Table 2. In all of the cases, the results were similar to those of Examples 1 to 10.

EXAMPLES 16 TO 22 AND COMPARATIVE EXAMPLES 8 TO 11

The procedures of Examples 1 to 10 were repeated except that the liquid crystal polyester (C) was used as the component (A) and the cylinder temperature was set at 290° C. The results are shown in Table 3. The results of Examples 16 to 22 were similar to those of Examples 1 to 10, and the results of Comparative Examples 8 to 11 were similar to those of Comparative Examples 1 to 7.

In Examples 18, 19, 21 and 22, circuits having a line width of 0.2 mm were formed using the plated test pieces, according to the above-mentioned method. Good circuits were obtained.

COMPARATIVE EXAMPLES 12 to 14

The liquid crystal polyester A, B or C was mixed with a glass fiber having an average diameter of 13 μm and an average length of 3 mm (CSO3MAPXI produced by Asahi Fiber Glass Co.) and dolomite according to the compounding recipe shown in Table 4. There were prepared various test pieces from each resulting composition in the same manner as in Examples 1 to 10, and they were measured for various test items. In any of the compositions, the anisotropy in degree of shrinkage was low and no warpage was seen, and furthermore the mechanical properties and heat resistance were excellent. However, the plating layer had a very poor appearance, and when made into a printed circuit board, the circuit had merely a line width of about 1 mm.

TABLE 1

| | Liquid crystal polyester | | Inorganic fibrous or acicular material | | Carbonate of alkaline earth metal | | Anisotropy Degree of shrinkage (%) | | Mechanical properties | |
|---|---|---|---|---|---|---|---|---|---|---|
| | Type | Amount (%) | type | Amount (%) | type | Amount (%) | MD | TD | Tensile strength (kg/cm$^2$) | Elastic modulus in bending (kg/cm$^2$) |
| Example 1 | A | 85 | Glass fiber | 10 | Magnesium carbonate | 5 | 0.12 | 0.86 | 1110 | 86000 |
| Example 2 | A | 70 | Glass fiber | 20 | Calcium carbonate | 10 | 0.10 | 0.75 | 1060 | 105000 |
| Example 3 | A | 60 | Glass fiber | 20 | Calcium carbonate | 20 | 0.12 | 0.72 | 950 | 106000 |
| Example 4 | A | 50 | Glass fiber | 40 | Calcium carbonate | 10 | 0.08 | 0.51 | 980 | 138000 |
| Example 5 | A | 60 | Glass fiber | 30 | Calcium carbonate | 10 | 0.09 | 0.59 | 1030 | 105000 |
| Example 6 | A | 60 | Glass fiber | 30 | Dolomite | 10 | 0.09 | 0.62 | 1040 | 104000 |
| Example 7 | A | 60 | Potassium titanate fiber | 30 | Dolomite | 10 | 0.10 | 0.70 | 1140 | 110000 |
| Example 8 | A | 60 | Wallastonite | 30 | Dolomite | 10 | 0.12 | 0.72 | 980 | 102000 |
| Example 9 | A | 60 | Wallastonite | 20 | Dolomite | 20 | 0.16 | 0.77 | 940 | 102000 |
| Example 10 | A | 60 | Ceramic fiber | 30 | Dolomite | 10 | 0.09 | 0.67 | 1000 | 104000 |
| Comparative Example 1 | A | 83 | Glass fiber | 2 | Dolomite | 15 | 0.14 | 1.15 | 950 | 84000 |
| Comparative Example 2 | A | 35 | Glass fiber | 55 | Dolomite | 10 | 0.07 | 0.41 | 720 | 172000 |
| Comparative Example 3 | A | 68 | Glass fiber | 30 | Dolomite | 2 | 0.10 | 0.67 | 1120 | 104000 |
| Comparative Example 4 | A | 55 | Glass fiber | 10 | Dolomite | 35 | 0.18 | 0.75 | 650 | 98000 |
| Comparative Example 5 | A | 83 | Potassium titanate fiber | 2 | Calcium carbonate | 15 | 0.16 | 1.20 | 900 | 82000 |
| Comparative Example 6 | A | 83 | Wallastonite | 2 | Calcium carbonate | 15 | 0.18 | 1.23 | 890 | 81000 |
| Comparative Example 7 | A | 83 | Ceramic fiber | 2 | Calcium carbonate | 15 | 0.15 | 1.18 | 850 | 85000 |

| | Thermal properties | | Plating properties | |
|---|---|---|---|---|
| | Heat distortion temperature (°C.) | Soldering heat resistance (°C.) | Adhesion strength (kg/cm) | Appearance of plating layer[1] |
| Example 1 | 265 | 290 | 0.9 | ◉ |
| Example 2 | 271 | 300 | 1.1 | ○ |
| Example 3 | 270 | 290 | 1.5 | ○ |
| Example 4 | 275 | 310 | 1.6 | △ |
| Example 5 | 273 | 300 | 1.9 | ○ |
| Example 6 | 273 | 300 | 2.0 | ○ |
| Example 7 | 269 | 300 | 1.6 | ◉ |
| Example 8 | 270 | 300 | 1.4 | ◉ |
| Example 9 | 268 | 290 | 1.3 | ○ |
| Example 10 | 273 | 300 | 1.8 | ◉ |
| Comparative Example 1 | 262 | 280 | 0.7 | ○ |
| Comparative | 280 | 310 | 1.0 | X |

TABLE 1-continued

| | | | | |
|---|---|---|---|---|
| Example 2 | | | | |
| Comparative Example 3 | 270 | 300 | 0.4 | Δ |
| Comparative Example 4 | 268 | 280 | 1.2 | X |
| Comparative Example 5 | 260 | 280 | 0.7 | ○ |
| Comparative Example 6 | 259 | 280 | 0.6 | ○ |
| Comparative Example 7 | 261 | 280 | 0.8 | ○ |

[1] Appearance of plating layer: Excellent ⊙ > ○ > Δ > X Poor

TABLE 2

| | Composition (% by weight) | | | | | | Anisotropy Degree of shrinkage (%) | |
|---|---|---|---|---|---|---|---|---|
| | Liquid crystal polyester | | Inorganic fibrous or acicular material | | Carbonate of alkaline earth metal | | | |
| | Type | Amount (%) | type | Amount (%) | type | Amount (%) | MD | TD |
| Example 11 | B | 85 | Glass fiber | 10 | Magnesium carbonate | 5 | 0.13 | 0.83 |
| Example 12 | B | 60 | Glass fiber | 20 | Dolomite | 20 | 0.12 | 0.70 |
| Example 13 | B | 60 | Potassium titanate fiber | 30 | Dolomite | 10 | 0.10 | 0.68 |
| Example 14 | B | 50 | Wallastonite | 40 | Dolomite | 10 | 0.12 | 0.71 |
| Example 15 | B | 60 | Ceramic fiber | 30 | Calcium carbonate | 10 | 0.09 | 0.64 |

| | Mechanical properties | | Thermal properties | | Plating properties | |
|---|---|---|---|---|---|---|
| | Tensile strength (kg/cm$^2$) | Elastic modulus in bending (kg/cm$^2$) | Heat distortion temperature (°C.) | Soldering heat resistance (°C.) | Adhesion strength (kg/cm) | Appearance of plating layer[1] |
| Example 11 | 920 | 75000 | 268 | 290 | 0.8 | ○ |
| Example 12 | 780 | 93000 | 274 | 300 | 1.4 | ○ |
| Example 13 | 720 | 97000 | 273 | 310 | 1.5 | ⊙ |
| Example 14 | 790 | 116000 | 273 | 310 | 1.2 | Δ |
| Example 15 | 860 | 92000 | 272 | 310 | 1.8 | ⊙ |

[1] Appearance of plating layer: Excellent ⊙ > ○ > Δ > X Poor

TABLE 3

| | Composition (% by weight) | | | | | | Anisotropy Degree of shrinkage (%) | | Mechanical properties | |
|---|---|---|---|---|---|---|---|---|---|---|
| | Liquid crystal polyester | | Inorganic fibrous or acicular material | | Carbonate of alkaline earth metal | | | | Tensile strength (kg/cm$^2$) | Elastic modulus in bending (kg/cm$^2$) |
| | Type | Amount (%) | type | Amount (%) | type | Amount (%) | MD | TD | | |
| Example 16 | C | 85 | Glass fiber | 10 | Magnesium carbonate | 5 | 0.07 | 0.51 | 1420 | 114000 |
| Example 17 | C | 60 | Glass fiber | 20 | Dolomite | 20 | 0.10 | 0.47 | 1180 | 160000 |
| Example 18 | C | 60 | Glass fiber | 30 | Dolomite | 10 | 0.13 | 0.50 | 1310 | 169000 |
| Example 19 | C | 60 | Potassium titanate fiber | 30 | Dolomite | 10 | 0.10 | 0.46 | 1350 | 158000 |
| Example 20 | C | 60 | Wallastonite | 20 | Dolomite | 20 | 0.16 | 0.55 | 1140 | 115000 |
| Example 21 | C | 50 | Wallastonite | 40 | Dolomite | 10 | 0.18 | 0.49 | 1250 | 179000 |
| Example 22 | C | 60 | Ceramic fiber | 30 | Calcium carbonate | 10 | 0.14 | 0.52 | 1300 | 14000 |
| Comparative Example 8 | C | 83 | Glass fiber | 2 | Dolomite | 15 | 0.06 | 0.82 | 1280 | 89000 |
| Comparative Example 9 | C | 68 | Glass fiber | 30 | Dolomite | 2 | 0.09 | 0.50 | 1410 | 158000 |
| Comparative Example 10 | C | 83 | Wallastonite | 2 | Dolomite | 15 | 0.05 | 0.84 | 1260 | 87000 |
| Comparative Example 11 | C | 68 | Wallastonite | 30 | Dolomite | 2 | 0.10 | 0.52 | 1290 | 155000 |

| | Thermal properties | | Plating properties | |
|---|---|---|---|---|
| | Heat distortion temperature (°C.) | Soldering heat resistance (°C.) | Adhesion strength (kg/cm) | Appearance of plating layer[1] |
| Example 16 | 227 | 250 | 0.8 | ○ |
| Example 17 | 229 | 260 | 1.4 | ○ |
| Example 18 | 238 | 260 | 1.5 | ○ |
| Example 19 | 236 | 260 | 1.5 | ⊙ |
| Example 20 | 233 | 260 | 1.2 | ○ |
| Example 21 | 239 | 260 | 1.3 | ○ |
| Example 22 | 237 | 260 | 1.6 | ⊙ |

TABLE 3-continued

| | | | | | |
|---|---|---|---|---|---|
| | Comparative Example 8 | 224 | 250 | 0.8 | ◯ |
| | Comparative Example 9 | 226 | 260 | 0.4 | △ |
| | Comparative Example 10 | 222 | 250 | 0.7 | ◯ |
| | Comparative Example 11 | 235 | 260 | 0.4 | △ |

(1)Appearance of plating layer: Excellent ⊙ > ◯ > △ > X Poor

TABLE 4

| | Composition (% by weight) | | | | | | Anisotropy Degree of shrinkage (%) | |
|---|---|---|---|---|---|---|---|---|
| | Liquid crystal polyester | | Inorganic fibrous or acicular material | | Carbonate of alkaline earth metal | | | |
| | Type | Amount (%) | type | Amount (%) | type | Amount (%) | MD | TD |
| Comparative Example 12 | A | 60 | Glass fiber | 30 | Dolomite | 10 | 0.08 | 0.52 |
| Comparative Example 13 | B | 60 | Glass fiber | 30 | Dolomite | 10 | 0.07 | 0.48 |
| Comparative Example 14 | C | 60 | Glass fiber | 30 | Dolomite | 10 | 0.09 | 0.45 |

| | Mechanical properties | | Thermal properties | | Plating properties | |
|---|---|---|---|---|---|---|
| | Tensile strength (kg/cm²) | Elastic modulus in bending (kg/cm²) | Heat distortion temperature (°C.) | Soldering heat resistance (°C.) | Adhesion strength (kg/cm) | Appearance of plating layer(1) |
| Comparative Example 12 | 1100 | 125000 | 277 | 300 | 1.7 | X |
| Comparative Example 13 | 1210 | 132000 | 278 | 300 | 1.6 | X |
| Comparative Example 14 | 1500 | 165000 | 240 | 260 | 1.4 | X |

(1)Appearance of plating layer: Excellent ⊙ > ◯ > △ > X Poor

What is claimed is:

1. A resin composition for printed circuit board comprising:

(A) 30–90% by weight of a liquid crystal polyester having one of the following combinations of repeating units:

(I) a combination of 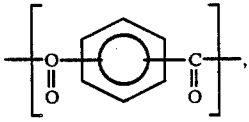,

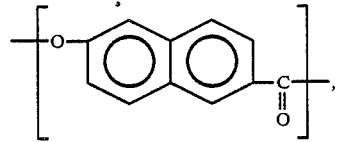, (II) a combination of 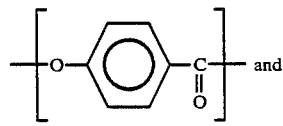 and

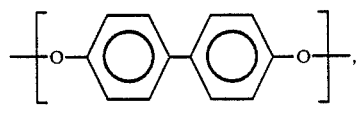, (III) a combination of 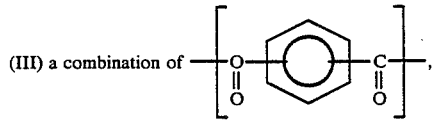,

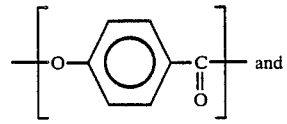 and

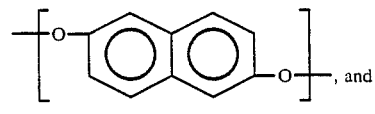, (IV) a combination of 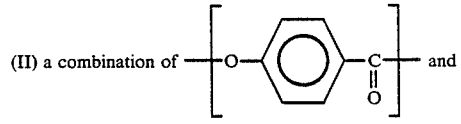 and 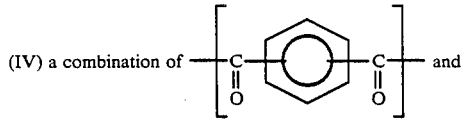

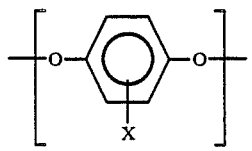

wherein X is alkyl, halogen or aryl,
(B) 3–50% by weight of an inorganic fibrous or acicular material having an average diameter of 15 μm or below and an average length of 200 μm or below, and
(C) 3–30% by weight of an alkaline earth metal carbonate.

2. A composition according to claim 1, wherein the inorganic fibrous or acicular material is selected from the group consisting of a glass fiber, a potassium titanate fiber, wollastonite, a ceramic fiber composed mainly of $Al_2O_3$ and $SiO_2$, a boron fiber, a silicon carbide fiber, an alkali metal metaphosphate fiber and an asbestos fiber.

3. A composition according to claim 1, wherein the inorganic fibrous or acicular material is selected from the group consisting of a glass fiber, a potassium titanate fiber, wollastonite and a ceramic fiber composed mainly of $Al_2O_3$ and $SiO_2$.

4. A composition according to claim 1, wherein the alkaline earth metal of the alkaline earth metal carbonate is selected from the group consisting of magnesium, calcium, strontium and barium.

5. A composition according to claim 1, wherein the alkaline earth metal carbonate is selected from the group consisting of calcium carbonate, magnesium carbonate and an eutectoid of calcium carbonate and magnesium carbonate, i.e., dolomite.

6. A composition according to claim 1, wherein the total amount of the component (B) and the component (C) is 10–70% by weight based on the total resin composition.

7. A composition according to claim 6, wherein the amounts of the component (B) and the component (C) are 10–40% by weight and 5–20% by weight, respectively, based on the total resin composition.

8. A composition according to claim 1 further comprising at least one member selected from the group consisting of an antioxidant, a heat stabilizer, an ultraviolet absorber, a lubricant, a releasing agent, a dye, a pigment, a flame retardant, a flame-retarding aid, an antistatic agent, thermoplastic resins consisting of a polyamide, a polyester, a polyphenylene sulfide, a polyetherketone, a polycarbonate, a modified polyphenylene oxide, a polysulfone, a polyetherimide and a polyamideimide, and thermosetting resins consisting of a phenolic resin, an epoxy resin and a polyimide resin.

* * * * *

UNITED STATES PATENT AND TRADEMARK OFFICE
CERTIFICATE OF CORRECTION

PATENT NO. : 4,943,606

DATED : JULY 24, 1990

INVENTOR(S) : MASAKAZU INOUE ET AL

It is certified that error appears in the above-identified patent and that said Letters Patent is hereby corrected as shown below:

Column 5, line 35;

Column 5, line 65;

(CLAIM 1) Column 17, lines 45-50; and

Column 18, lines 45-50, in each instance, after "a combination of" change the structural formula

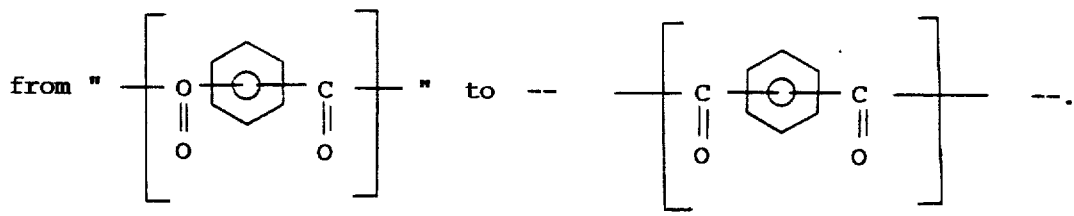

Signed and Sealed this

Twenty-eighth Day of July, 1992

Attest:

DOUGLAS B. COMER

*Attesting Officer*      *Acting Commissioner of Patents and Trademarks*